United States Patent [19]

Pausini et al.

[11] 3,903,482

[45] Sept. 2, 1975

[54] ARRANGEMENT FOR INTERFERENCE SUPPRESSION IN PHASE LOCKED LOOP SYNCHRONIZED OSCILLATORS

[75] Inventors: Ferruccio Pausini; Giorgio Squartini, both of Rome, Italy

[73] Assignee: Telefonaktiebolaget LM Ericsson, Stockholm, Sweden

[22] Filed: June 6, 1974

[21] Appl. No.: 476,897

[30] Foreign Application Priority Data

June 18, 1973 Italy ................................ 50862/73

[52] U.S. Cl. .................................... 331/17; 331/25

[51] Int. Cl.[2] ........................................ H03B 3/04

[58] Field of Search .................... 331/17, 18, 25, 14

[56] References Cited

UNITED STATES PATENTS 3,223,943 12/1965 Dumaire et al. ...................... 331/17

3,573,649 4/1971 West ................................... 331/14

*Primary Examiner*—Siegfried H. Grimm

*Attorney, Agent, or Firm*—Hane, Baxley & Spiecens

[57] ABSTRACT

In a phase locked loop synchronized oscillator wherein a phase detector compares an oscillator frequency and a synchronizing frequency to derive a voltage for controlling the oscillator frequency there is provided a memory circuit between the phase detector and the oscillator for holding the instantaneous value of the detector output and a blocking circuit for sensing for interferences in the control voltage to prevent the memory from changing the value hold before the interference occurred.

7 Claims, 4 Drawing Figures

ARRANGEMENT FOR INTERFERENCE SUPPRESSION IN PHASE LOCKED LOOP SYNCHRONIZED OSCILLATORS

The invention relates to an arrangement for interference suppression in synchronized oscillators especially intended to be included in telecommunication plants.

In telecommunication plants based on frequency multiplex transmission it is a well-known problem to synchronize the main oscillators from which the different carrier frequencies are derived. Owing to the fact that the number of channels in such plants increase more and more (today there are systems with 10,800 channels), the demands on the frequency stability of these main oscillators increase. It has therefore been necessary to adjust these oscillators frequently which adjustments must be made by a staff specially trained.

In order to reduce the need for these adjustments and in order to improve the transmission quality it has been proposed to synchronize the different main oscillators in a station or even within a whole network to just one synchronizing signal which is received from a reference oscillator.

In the system generally used for synchronizing an oscillator a frequency equal to the synchronizing frequency is derived from the frequency of the oscillator which is to be synchronized. These two frequencies are compared in a phase comparator on the output of which a direct voltage proportional to the phase difference between the two frequencies is obtained after suitable filtering. This direct voltage controls the tuning of the main oscillator for example by influencing a varactor diode included in the tuning circuit (phase locked loop oscillators).

If one of the two frequencies deviates from the other a change of the phase difference arises which in its turn causes a voltage change across the varactor diode, and the frequency of the controlled oscillator is changed until synchronism between the two frequencies is restored.

In equipments of this kind it is necessary to provide a memory circuit which can store the direct voltage controlling the varactor diode because if the synchronizing signal is interrupted the main oscillator must not be allowed to deviate from the frequency that the oscillator had before the interruption. Otherwise a great number of channels would be put out of operation. The memory circuit should function even for a momentary interruption in the supply voltage, for otherwise such a short voltage drop together with a contemporaneous absence of the synchronizing signal would cause a corresponding channel drop out.

The equipments, based on these principles, which until now have been known, have, however, an important drawback because they have been shown to be sensitive to interferences in the synchronizing frequency. If the synchronizing signal undergoes a sudden phase change for example by an interference or the operation of a switching device the phase comparator at heretofore known synchronizing equipment will react upon this phase change and the frequency of the oscillator will be changed. Since the two frequencies compared in the comparator are now different a quick change of the phase difference and consequently of the output voltage of the comparator will take place causing the frequency of the oscillator to change until the position of equilibrium prevailing before the phase jump interference is restored.

When the phase difference between the two frequencies which are compared in the phase comparator has returned to the value prevailing before the interference the output voltage of the comparator becomes again such a value that the oscillator frequency corresponds to the synchronizing signal and the phase difference is no longer changed. Accordingly one can conclude that in a known synchronizing arrangement as interference, for example a phase jump, causes a transient interval during which the frequency generated by the main oscillator no longer is equal to the synchronizing frequency. The difference between the oscillator frequency and the synchronizing frequency can maximally be as large as the synchronizing range. The synchronizing range is defined in this connection as the variation range of the oscillator frequency.

The transient condition during which the oscillator frequency is not correct has a duration which depends on the construction of the synchronizing equipment but normally it will probably be from about some 10 seconds to some 10 minutes.

An object of the present invention is to achieve an arrangement for interference suppression in a synchronized oscillator comprising a voltage controlled oscillator which, via a low-pass filter, is controlled by a control voltage derived by a phase comparison between the oscillator frequency and a synchronizing frequency.

The invention is characterized by a memory circuit connected between the low-pass filter and the control input of the voltage controlled oscillator, of arrangements for normally storing the instantaneous value of the control voltage in the memory circuit, and of blocking means for blocking the arrangements during interferences in the control signal, so that the interference cannot influence the control voltage stored in the memory circuit and applied to the input of the voltage controlled oscillator.

The invention will be described more in detail with reference to the accompanying drawings, where:

Figure 1:
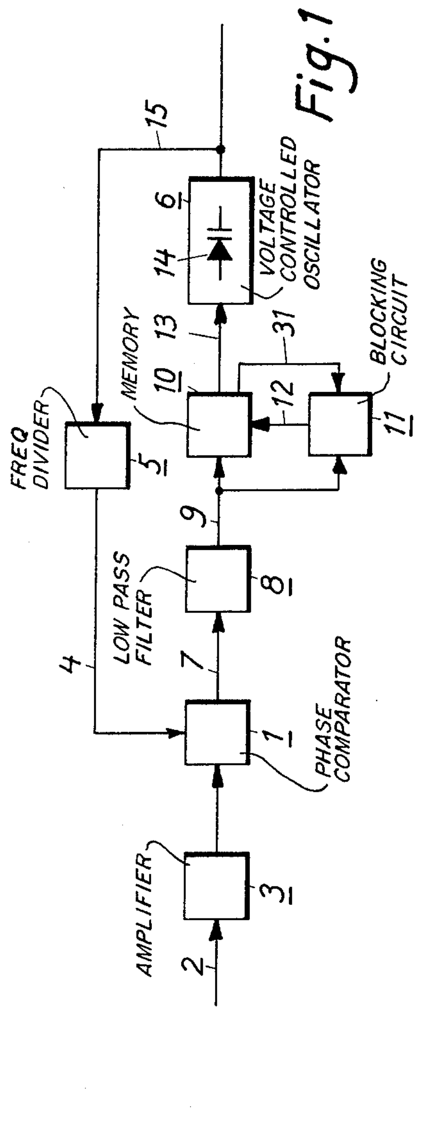
FIG. 1 shows a block diagram of a synchronized oscillator

A synchronized oscillator according to the embodiment shown in the figures comprises a phase comparator 1 with two inputs where the first input receives a synchronizing signal from a synchronizing signal line 2 after amplification in an amplifier 3. The second input is fed through the line 4 with a signal which is obtained from a frequency divider 5 dividing the output signal from a voltage controlled oscillator 6 with such a factor that the divided oscillator frequency and the synchronizing frequency correspond.

The output from the phase comparator 1 is through the line 7 connected to a low-pass filter 8 the output of which through the line 9 is connected on one the hand to the input of a memory circuit 10, on the other hand to a first input on a blocking circuit 11. The purpose of circuit 11 is to activate the memory circuit as soon as interferences appear on the line 9, as is described in detail below. One of the outputs of the memory circuit 10 is connected in line 13 to a varactor diode 14 which is included in the tuning circuit of the oscillator 6. The other output of the memory circuit is connected through a line 31 to a second input of the blocking circuit 11. The output from the oscillator 6 is connected to the input on the frequency divider 5 through a line 15.

Figure 2:
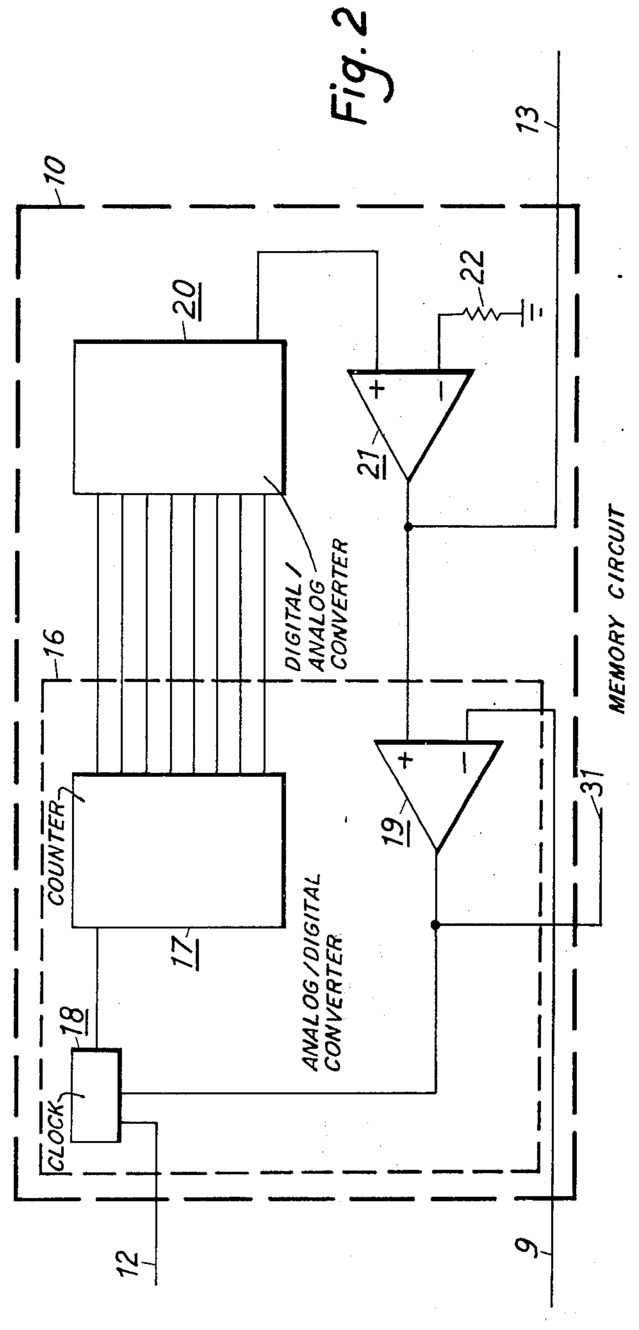
FIG. 2 shows a more detailed block diagram of a memory circuit of FIG. 1.

The circuit works in the following manner: The phase comparator 1 compares the phase position of the synchronizing signal from the line 2 with the phase position of the signal from the oscillator 6 divided to the frequency of the synchronizing signal. The purpose of the memory circuit 10 is to store the output direct voltage from the comparator 1 before it is applied across the varactor diode 14 in the oscillator 6. The purpose of the blocking circuit 11 is, as is previously mentioned, to control that the memory circuit stores the right oscillator control voltage value each time an interference appears on the line 9. In an embodiment of the memory circuit 10 according to FIG. 2 the memory circuit is digital. It consists of an analog/digital converter 16 with a capacity of 8 bits. The analog signal is applied through the line 9 and the digital output value is received in parallel on the eight conductors which are connected to the inputs of a digital/analog converter 20, also with a capacity of 8 bits. The output from the converter 20 is connected to one input of a differential amplifier 21 the other input of which is connected to a fixed potential (ground) through a resistor 22. The output of the amplifier 21 is connected to the line 13.

The converter 16 comprises a counter 17 with eight binary stages the individual stages of which are connected to the inputs on the digital/analog converter 20. The input is connected to a clock pulse generator 18 which is provided with two control inputs one of which is connected to the line 12 and the other is connected to the output of a differential amplifier 19. One of the two inputs of the differential amplifier 19 is connected to the line 9 while the other is connected to the output of the amplifier 21.

The memory circuit operates in the following manner. The analog/digital converter 16 the purpose of which is to convert the input voltage on the line 9 to a numerical information represented in binary form on the eight outputs of the counter 17. The counter 17 is fed with the clock pulses from the clock pulse generator 18 but, however, only when the differential amplifier 19 has an output voltage which is differing from zero. The counter direction of the counter 17 depends on the polarity of the output voltage of the differential amplifier 19. If, for example, the output voltage of the digital/analog converter 20 is higher than the input voltage on line 9, the counter is stepped back until balance is reached. When the output voltage of the differential amplifier 19 is equal to zero which is the case when the two input voltages are equal the counter stops.

The digital/analog converter 20 returns the binary information stored on the output of the counter 17 to analog form. After amplification in the amplifier 21 the analog voltage is fed into one of the inputs at the differential amplifier 19 which works as a voltage comparator. Thus an output voltage which is equal to the input voltage within one step of the digital/analog converter appears on the output line 13. If the counter 17 according to FIG. 2 has eight binary stages the output voltage from the digital/analog converter 20 has 256 different levels and the interval becomes equal to the maximal value of the input direct voltage divided by 256.

Figure 3:
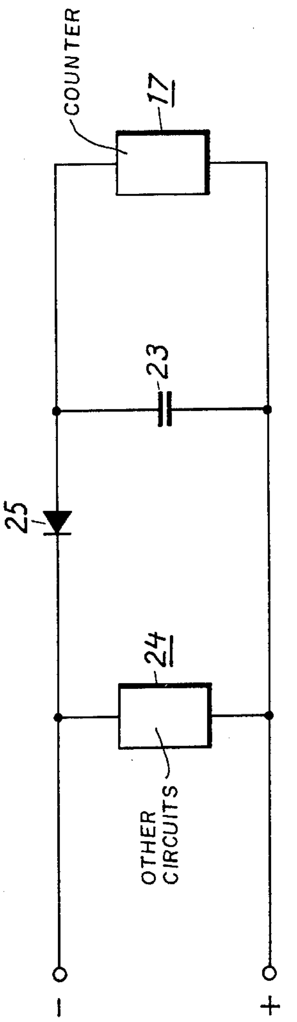
FIG. 3 shows a supply circuit for the memory circuit.

The blocking circuit designated by 11 in FIG. 1 is arranged to stop the clock pulse generator 18 by emitting a stop signal on the line 12 if, for example, the supply voltage fails. The counter 17 therefore retains the numerical information which it held before the interruption in the supply voltage. To prevent the information in the counter from disappearing if the counter would be affected by the interruption in the supply voltage the counter is suitably constructed as a complementary MOS integrated circuit (COS-MOS). Such a counter can work even if the supply voltage varies within wide limits, and its current consumption is very low. This makes it possible to maintain the stored numerical information by means of a simple capacitive store circuit even if the supply voltage falls away for some seconds. Such a circuit is shown in FIG. 3, where a capacitor 23 is connected in parallel to the supply circuit of the counter 17. The counter is insulated from remaining circuits 24 through a diode 25. If the power supply voltage drops off the capacitor 23 maintains enough supply voltage across the counter 17 simultaneously because the remaining circuits 24 are prevented from discharging the capacitor by the non-conducting diode 25.

Figure 4:
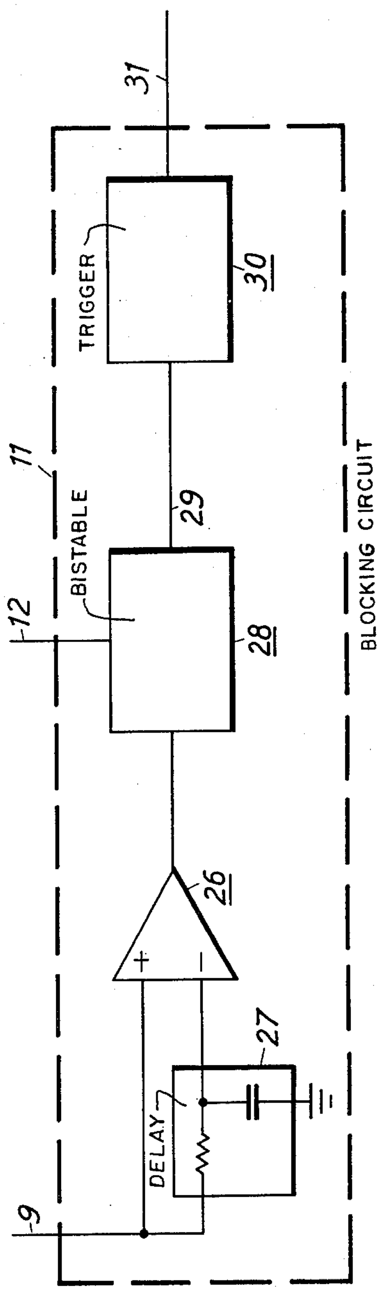
FIG. 4 shows a more detailed block diagram of the blocking circuit according to FIG. 1.

FIG. 4 shows a block diagram of the blocking circuit 11. The output voltage from the low-pass filter 8 is fed, besides to the memory circuit 10, also to the input of the blocking circuit 11, where the input is connected on the one hand directly to one input of a differential amplifier 26, and on the other hand through a delay circuit 27 to the other input of the same differential amplifier 26. Supposing that the output voltage from the low-pass filter 8 is changed suddenly owing to a phase change in the synchronizing signal a pulse is received on the output of the ampliier 26. The voltage on the second input is namely unchanged a certain time owing to the delay circuit 27, while the voltage on the first input immediately follows each voltage change. The differential amplifier 26 is therefore unbalanced for a certain time which depends on the properties of the delay circuit. This impulse on the output of the differential amplifier 26 sets a bistable flip-flop 28 causing a blocking signal on the line 12. The clock pulse generator 18 is blocked and the voltage on the output from the memory 10 maintained. The blocking action remains until the bistable flip-flop 28 is reset by an impulse on the input 29 This impulse is obtained from a trigger circuit 30 when its input which is connected to the output of the comparator 19 via a line 31 has a zero level. This condition is fulfilled only when the input voltage of the memory again is equal to the output voltage.

To sum up, the blocking circuit 11 works so that it prevents the clock pulse generator 18 from influencing the counter 17 as soon as a fast change appears of the output voltage from the low-pass filter 8, the oscillator 6 maintaining its frequency until the phase and therewith the voltage on the output of the low-pass filter 8 again reaches the value it had before the interference.

Of course, the blocking circuit operates also when a synchronizing signal fails, as the voltage on the output of the phase comparator suddenly disappears, causing the memory circuit to be locked and to continue sending the same control voltage to the oscillator as before the drop out of the synchronizing signal.

The invention is not limited to the embodiment above shown but it can be modified within the scope of the claims.

We claim:

1. An interference rejecting synchronized oscillator comprising: a voltage controlled oscillator having an output and a control input, a phase detector means having a first input connected to the output of said voltage controlled oscillator, a second input adapted to receive a synchronism signal and an output for comparing the frequency of the signal generated by said voltage controlled oscillator with the frequency of the synchronizing signal and transmitting from said output a control voltage, storage means for holding the instantaneous value of the control voltage, said storage means having an input connected to the output of said phase detector means and an output connected to the control input of said voltage controlled oscillator, blocking means having an input connected to said phase detector means and activated by transient changes in the control voltage for preventing such transient changes from changing the control voltage stored in said storage means and deactivating means responsive to the termination of such transient changes for deactivating said blocking means.

2. The oscillator claimed in claim 1 wherein said deactivating means comprises means for emitting a deactivating signal to said blocking means when a predetermined relationship exists between amplitude of the control voltage stored in said storage means and the amplitude of the control voltage transmitted from said phase detector means.

3. The oscillator claimed in claim 1 wherein said phase detector means includes a phase detector and a low pass filter and said storage means comprises: an analog/digital converter having an analog input connected to the output of said low-pass filter, a second blocking input connected to said blocking means and a third input, a number N of digital outputs corresponding to the capacity of the analog/digital converter; a digital/analog converter having N digital inputs connected to said digital outputs and an analog output connected on the one hand to the control input of said voltage controlled oscillator and on the other hand to said third input.

4. The oscillator claimed in claim 3 wherein the analog/digital converter comprises a first differential amplifier having a first input connected to said analog input and a second input connected to the output of said digital/analog converter; a clock pulse generator having a first clock control input connected to said second blocking input, and a second clock control input connected to the output of said first differential amplifier; a counter stepped by clock pulses and provided with N parallel outputs connected to said digital/analog converter, a count input on said counter being connected to the output of said clock pulse generator; and means for halting said clock pulse generator when the output voltage of the first differential amplifier is zero and for stepping the counter when said output voltage differs from zero, the stepping direction of the counter depending on the polarity of said output voltage.

5. The oscillator claimed in claim 4 wherein the counter is at least one integrated circuit having low power consumption, preferably a complementary MOS integrated circuit, said integrated circuit having power supply terminals, a capacitor being connected in parallel across said terminals, a power supply, means including diode means for connecting said terminals to said power supply in series, said diode means polarized to prevent said capacitor from discharging through circuits other than said integrated circuit in the event said power supply fails.

6. The oscillator claimed in claim 4 wherein the blocking means comprise a second differential amplifier having first and second inputs and an output, means for connecting the first input directly to said analog output, delay means for connecting the second input to said analog output, a bistable flip-flop having a set input, a reset input and an output, means for connecting the output of said second differential amplifier to the set input of the bistable flip-flop, and means for connecting the reset input of said flip-flop to said deactivating means.

7. The oscillator as claimed in claim 6 wherein said means for connecting the reset input to said deactivating means comprises a trigger circuit means having an output connected to said reset input and an input connected to the output of said first differential amplifier.

* * * * *